United States Patent [19]
Fujita

[11] Patent Number: 6,107,212
[45] Date of Patent: *Aug. 22, 2000

[54] METHOD OF AND APPARATUS FOR MANUFACTURING SEMICONDUCTOR DEVICES

[75] Inventor: Shigeru Fujita, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/090,910

[22] Filed: Jun. 5, 1998

[30] Foreign Application Priority Data

Jun. 12, 1997 [JP] Japan .................................. 9-154675

[51] Int. Cl.⁷ .................................................. H01L 21/31
[52] U.S. Cl. ........................... 438/758; 438/680; 438/782
[58] Field of Search .................... 148/DIG. 25; 438/795, 438/764, 680, 758, 782; 427/581, 590; 118/719

[56] References Cited

U.S. PATENT DOCUMENTS

| | | | |
|---|---|---|---|
| 4,824,518 | 4/1989 | Hayakawa et al. | 148/DIG. 25 |
| 4,960,720 | 10/1990 | Shimbo | 148/DIG. 25 |
| 5,135,608 | 8/1992 | Okutani | 438/584 |
| 5,259,918 | 11/1993 | Akbar et al. | 117/90 |
| 5,286,296 | 2/1994 | Sato et al. | 118/719 |
| 5,286,334 | 2/1994 | Akbar et al. | 156/62 |
| 5,302,855 | 4/1994 | Matsumoto et al. | 257/774 |
| 5,388,944 | 2/1995 | Takanabe et al. | 118/719 |
| 5,433,785 | 7/1995 | Saito | 118/719 |
| 5,589,421 | 12/1996 | Miyashita et al. | 438/758 |
| 5,607,511 | 3/1997 | Meyerson | 118/725 |
| 5,700,719 | 12/1997 | Yuzurihara et al. | 438/621 |

*Primary Examiner*—Carl Whitehead, Jr.
*Assistant Examiner*—Maria Guerrero
*Attorney, Agent, or Firm*—Hill & Simpson

[57] ABSTRACT

A method of and an apparatus for manufacturing semiconductor devices by transporting wafers by way of an evacuated load lock chamber into a reaction furnace, which conducting processing under heating at a reduced pressure, wherein the wafers are entered into the load lock chamber and, subsequently, wafers are heated simultaneously with evacuation of the load lock chamber. Time for entering wafers from the load lock chamber into the reaction chamber can be shortened thereby shortening the processing time per one batch.

4 Claims, 5 Drawing Sheets

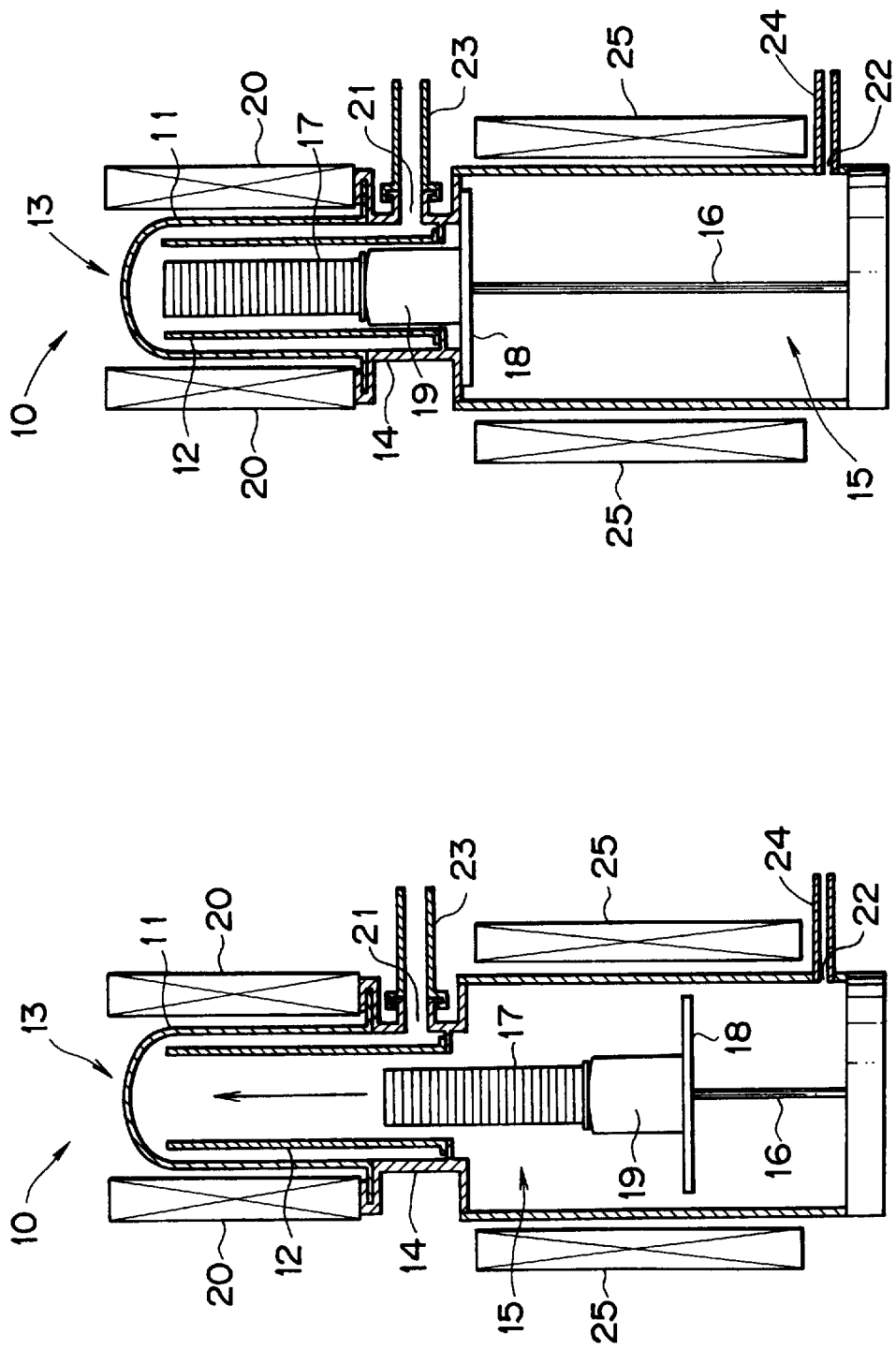

METHOD OF AND APPARATUS FOR MANUFACTURING SEMICONDUCTOR DEVICES

BACKGROUND OF THE INVENTION

1. Field of the Invention

The present invention relates to a method of and an apparatus for manufacturing semiconductor devices and, more in particular, it relates to a method of manufacturing semiconductor devices of transporting wafers by way of a load lock chamber of conducting heating for the wafers simultaneously with evacuation into a reaction chamber for conducting processing under heating at a reduced pressure.

2. Description of Related Art

Along with progress for improvement of the performance and increase for the degree of integration of semiconductor devices in recent years, the performance of LP (low pressure)-CVD apparatus has also been improved. In a vertical type LP-CVD apparatus, wafers are once stayed in a load lock chamber (preliminary vacuum chamber) and then transported into a reaction chamber for maintaining vacuum in the vacuum reaction chamber and preventing growth of spontaneously oxidized films to silicon wafers.

As shown in FIG. 4, a load lock type vertical LP-CVD apparatus 1 comprises a vertical reaction furnace (reaction chamber 3) having an outer tube 2a closed at a dome-shaped upper end and closed at a lower end, and an inner tube 2b also made of quartz disposed in the outer tube 2 and opened at both upper and lower ends. The outer tube 2a and the inner tube 2b are secured at the circumferential edge of each of their lower ends to a cylindrical flange 4, and a load lock chamber 5 in communication with the reaction furnace 3 by way of the inner tube 2b is attached to the lower end of the flange 4. A jig 6, referred to as a quartz boat which is made, for example, of quartz glass at high purity and adapted to move vertically along a lifting shaft 5a protruded at the bottom (refer to FIGS. 5A and 5B) and enter the inner tube 2b upon upward movement is contained in the load lock chamber 5.

A plurality of vertically arranged shelves are disposed to the quartz boat 6, and about 100 to 150 silicon wafers can be contained at once by the shelves. The quartz boat 6 is secured on a boat base 7 having a boat cap 7a at the lower end. The boat cap 7a comprises a plate of a diameter larger than that of a lower end opening of the flange 4, so that the quartz boat 6 entering the inner tube 2b stops its upward movement upon abutment of the boat cap 7a against the lower end of the flange 4 and tightly seals the inside of the reaction chamber.

A reaction furnace heater 8 surrounding the outer tube 2a is disposed to the outside of the outer tube 2a such that the temperature of the quartz boat 6 entering the inner tube 2 can be elevated. The flange 4 has an exhaust port 4a in communication with a gap defined between the inner tube 2a and the outer tube 2b, and the load lock chamber 5 has an evacuating exhaust port 5b formed in communication with a vacuum pump (not illustrated) for instance. An exhaust pipe 4b is attached to the exhaust port 4a and an exhaust pipe 5c is attached to the evacuating exhaust port 5b, respectively.

A method of film formation of silicon wafers by the load lock type vertical LP-CVD apparatus 1 will be explained below.

At first, as shown in FIG. 4, after containing silicon wafers in the quartz boat 6 in the load lock chamber 5, the load lock chamber 5 is evacuated through the evacuating exhaust port 5b. In this case, the lower end opening of the flange 4 is closed on the side of the load lock chamber 5 by a furnace opening cap 9, and the reaction furnace 3 and the load lock chamber 5 are isolated. The inside of the reaction furnace 3 is evacuated and the temperature in the furnace is kept at a film-forming temperature by CVD system, for example, at about 750 to 850° C.

Then, as shown in FIG. 5A, the furnace port cap (not illustrated) is opened and the quartz boat 6 is raised to transport the quartz boat 6 from the load lock chamber 5 to the reaction chamber 3. The temperature of the quartz boat 6 transported to the reaction furnace 3 is elevated from the temperature in the load lock chamber which is at a normal temperature to a higher temperature in the reaction furnace (750 to 850° C.).

Subsequently, as shown in FIG. 5B, when the boat cap 7a abuts against the lower end of the flange 4 to tightly close the lower end opening, the quartz boat 6 entering into the reaction furnace 3 stops its upward movement and furnace entry is completed. After completing the furnace entry, the inside of the reaction furnace 3 is purged with nitrogen ($N_2$) and then film-forming processing for the silicon wafers is conducted in the reaction furnace 3 under heating at a reduced pressure.

However, the quartz boat 6 entering the reaction furnace 3 is put to a large temperature difference from the room temperature in the load lock chamber 5 to a high temperature region at 750 to 850° C. If the boat is transported under such a large temperature difference in a short period of time, since silicon wafers are deformed by abrupt temperature change, particles are formed or cracks referred to as slips are caused due to friction at a portion of the silicon wafers in contact with the quartz boat 6 (portion supporting the silicon wafers). Therefore, it has been necessary to enter the quartz boat 6 containing the silicon wafers at an extremely low entering speed of about 50 mm/min.

As a result, in a case of a quartz boat 6 containing 150 sheets of 8 inches silicon wafers, since the boat length is about 1.5–2 m, it takes about 20 to 30 min of furnace entery time, which gives an undesired effect on the throughput to result in a large factor of hindering the improvement of the reactivity.

SUMMARY OF THE INVENTION

The present invention has been accomplished in view of the foregoing situations and an object thereof is to provide a method of and an apparatus for manufacturing semiconductor devices capable of shortening the wafer entry time from a load lock chamber into a reaction chamber, thereby shortening the processing time per one batch.

The foregoing object can be attained in accordance with the present invention by a method of manufacturing a semiconductor device of transporting wafers by way of an evacuated load lock chamber into a reaction chamber for conducting processing under heating at a reduced pressure, wherein the method comprises entering wafers into a load lock chamber and, subsequently, heating the wafers simultaneously with evacuation for the load lock chamber.

With the constitution as described above, the wafers are entered into the load lock chamber and subsequently, the load lock chamber is evacuated and the temperature of the load lock chamber is elevated simultaneously, thereby heating and elevating the temperature of the wafers in the load lock chamber. Thus, since the wafers to be transported from the load lock chambers to the reaction chamber are heated to a temperature of the reaction chamber in the load lock chamber in which the temperature is elevated to a temperature substantially equal with the temperature in the reaction chamber, there is no abrupt temperature change between the load lock chamber and the reaction chamber, so that wafers entering the reaction chamber do not suffer from deformation, and neither particles are formed nor cracks referred to as slips are formed, and the wafer can be entered into the reaction chamber in a short period of time.

The present invention also provides, as a preferred embodiment, an apparatus for manufacturing semiconductor devices having a load lock chamber and adapted to process wafers under heating at a reduced pressure, wherein a heater is provided for the load lock chamber for elevating the temperature of wafers in the load lock chamber

BRIEF DESCRIPTION OF THE DRAWINGS

FIGS. 2A and 2B show the load-lock type vertical LP-CVD apparatus shown in FIG. 1. FIG. 2A is a cross sectional view, in the course of furnace entry of the quartz boat and FIG. 2B is a cross sectional view after completing furnace entry of the quartz boat;

FIG. 3A is an explanatory view by a graph for the prior art apparatus and FIG. 3B is an explanatory view by a graph for the apparatus according to the present invention;

FIG. 5A is a cross sectional view in the course of furnace entry of the quartz boat and FIG. 5B is a cross sectional view after the completion of furnace entry of the quartz boat.

DESCRIPTION OF PREFERRED EMBODIMENT

The present invention will be explained by way of a preferred embodiment with reference to the drawings.

Figure 1:
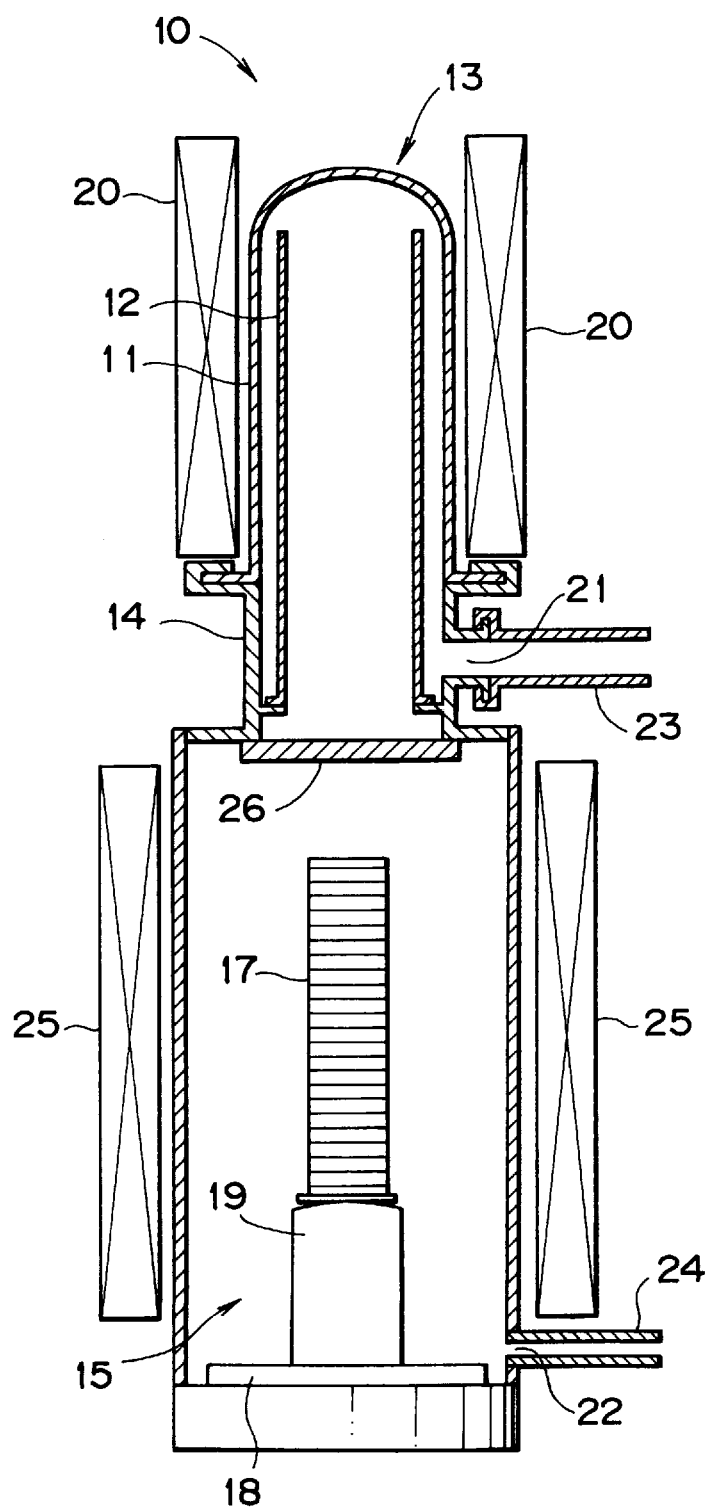
FIG. 1 is a cross sectional view illustrating a load-lock type vertical LP-CVD apparatus, in a state before entry of a quartz boat, in one embodiment according to the present invention.

FIG. 1 is a cross sectional view illustrating a load-lock type vertical LP-CVD apparatus in one embodiment of the present invention, in a state before furnace entry of a quartz boat. FIGS. 2A and 2B show the load-lock type vertical LP-CVD apparatus of FIG. 1. FIG. 2A is a cross sectional view showing a state in the course of furnace entry of the quartz boat and FIG. 2B is a cross sectional view showing the state after completion of furnace entry of the quartz boat.

The load lock type vertical LP-CVD apparatus as a manufacturing apparatus for semiconductor devices according to the present invention is constituted such that wafers in a load lock chamber can be heated to an elevated temperature by elevating the temperature of the load lock chamber. A heater for the load lock chamber is disposed, for elevating the temperature of the load lock chamber, to the load lock chamber of the load lock type vertical type LP-CVD apparatus of the prior art.

As shown in FIG. 1, a load lock type vertical LP-CVD apparatus 10 comprises a vertical reaction furnace (reaction chamber) 13 having an outer tube 11 closed at a dome-shaped upper end and closed at a lower end, and an inner tube 12 also made of quartz, disposed in the outer tube 2 and opened at both upper and lower ends. The outer tube 11 and the inner tube 12 are secured at the circumferential edge of each of their lower ends to a cylindrical flange 14, and a load lock chamber 15 in communication with the reaction furnace 13 by way of the inner tube 12 is attached to the lower end of the flange 14. A jig 17, referred to as a quartz boat which is made, for example, of quartz glass at high purity and adapted to move vertically along a lifting shaft protruded at the bottom (refer to FIGS. 2A and 2B) and enter the inner tube 12 upon upward movement is contained in the load lock chamber 15.

A plurality of vertically arranged shelves are disposed to the quartz boat 17, and about 100 to 150 silicon wafers can be contained at once by the shelves. The quartz boat 6 is secured on a boat base 19 having a boat cap 18 at the lower end. The boat cap 18 comprises a plate of a diameter larger than that of a lower end opening of the flange 14, so that the quartz boat 17 entering the inner tube 12 stops its upward movement upon abutment of the boat cap 18 against the lower end of the flange 14 and tightly seals the inside of the reaction chamber 13.

A reaction furnace heater 20 surrounding the outer tube 11 is disposed to the outside of the outer tube 11 such that the temperature of the quartz boat 17 entering the inner tube 11 can be elevated. The flange 14 has an exhaust port 21 in communication with a gap defined between the inner tube 11 and the outer tube 12, and the load lock chamber 15 has an evacuating exhaust port 22 formed in communication with a vacuum pump (not illustrated) for instance. An exhausted pipe 23 is attached to the exhaust port 23 and an exhaust pipe 24 is attached to the evacuating exhaust port 22, respectively.

A load lock chamber heater 25 surrounding the load lock chamber 15 is disposed to the outside of the load lock chamber 15. The load lock chamber heater 25 can elevate the temperature substantially over the entire area of the load lock chamber 15 to heat and elevate the temperature of silicon wafers contained in the quartz boat 17, together with the quartz boat 17 in the load lock chamber 15.

A method of film formation of silicon wafers by the load lock type vertical LP-CVD apparatus 10 will be explained below.

At first, as shown in FIG. 1, silicon wafers are contained in the quartz boat 17 in the load lock chamber 15, the silicon wafers are entered into the load lock chamber 15 and then the load lock chamber 15 is evacuated through the evacuating exhaust port 22 and, at the same time, the temperature of the load lock chamber 15 is elevated by the load lock chamber heater 25. In this case, the lower end opening of the flange 14 is closed on the side of the load lock chamber 15 by the furnace port cap 26, so that the reaction furnace 13 and the load lock chamber 15 are isolated from each other. Further, the inside of the reaction furnace 13 is evacuated and the temperature in the chamber is kept at a film-forming temperature by the CVD system, for example, at about 750 to 850° C.

For the evacuation of the load lock chamber 15, it takes about 30 min considering the capacity, and the temperature in the load lock chamber 15 is elevated during evacuation to about 750 to 850° C. which is equal with the temperature in the reaction furnace 13. By the temperature elevation of the load lock chamber 15, the silicon wafers contained in the quartz boat 17 are heated to an elevated temperature together with the quartz boat 17. Since the temperature of the load lock chamber 15 is elevated by utilizing the evacuation time as described above, no additional time is required for the temperature elevation of the load lock chamber 15.

Then, as shown in FIG. 2A, a furnace opening cap (not illustrated) is opened and the quartz boat 17 is moved upwardly to transport the quartz boat 17 from the load lock chamber 15 to the reaction furnace 13. In this case, since the temperature of the quartz boat 17 and the silicon wafers to be transferred to the reaction furnace 13 is elevated to the temperature of the load lock chamber 15 elevated substantially to the chamber temperature of the reaction furnace 13, they can be entered into the reaction furnace 13 at an entry speed, for example, of 1–3 m/min.

That is, since there is no abrupt temperature change between the load lock chamber 15 and the reaction furnace 13, silicon wafers contained in the quartz boat 17 entering the reaction furnace 13 do not suffer from deformation, neither particles are formed by "friction" nor cracks called as slips are caused in a portion of the silicon wafer in contact with the quartz boat 17 (portion supporting the silicon wafers). Accordingly, furnace entry time can be shortened greatly compared with the case of furnace entry at an extremely low entry speed of about 50 mm/min in the prior art.

Subsequently, as shown in FIG. 2A, when the boat cap 18 abuts against the lower end of the flange 14 to tightly close the lower end opening, the quartz boat 17 entering the reaction furnace 13 stops its upward movement and furnace entry is completed. After completing the furnace entry, the inside of the reaction chamber 13 is purged with nitrogen ($N_2$) and then film-forming processing for the silicon wafers is conducted in the reaction furnace 13 under heating at a reduced pressure.

Figures 3A, 3B:
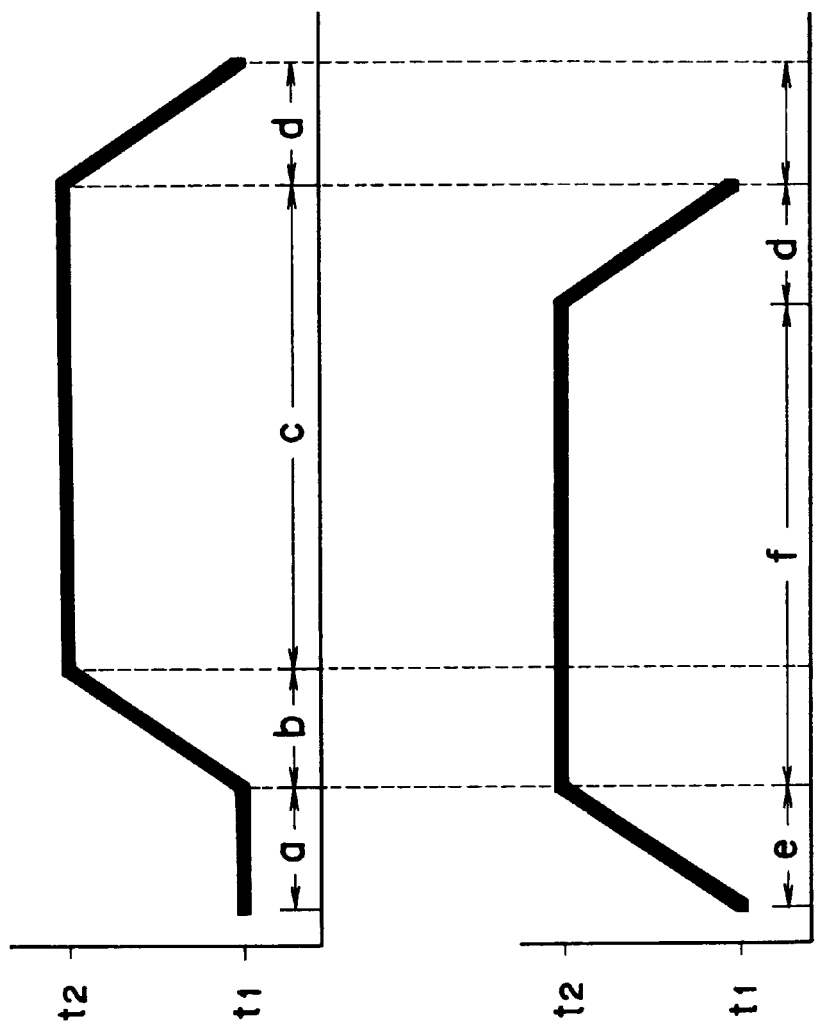
FIGS. 3A and 3B show a temperature change of silicon wafers during film-formation between a load lock type vertical LP-CVD apparatus of the prior art and a load lock type vertical LP-CVD apparatus according to the present invention in comparison.
Figure 4:
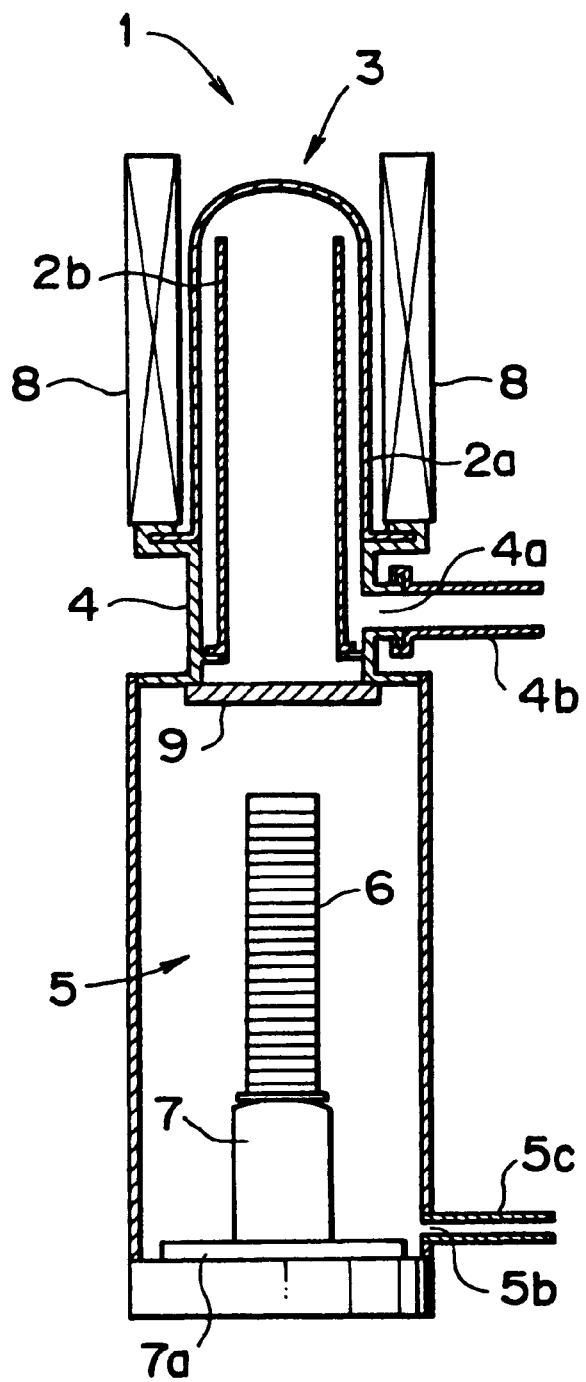
FIG. 4 is a cross sectional view illustrating a load lock type vertical LP-CVD apparatus of the prior art before furnace entry of a quartz boat.
Figure 5A:
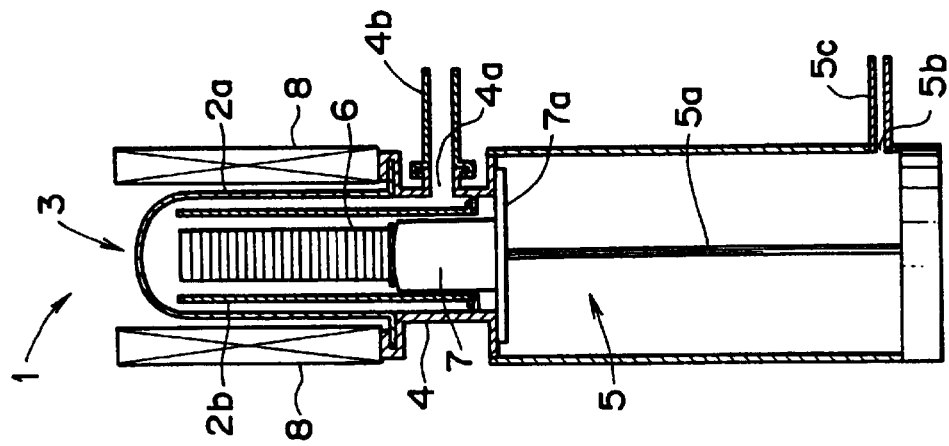
FIGS. 5A and 5B illustrate the load lock type vertical LP-CVD apparatus of FIG. 4.
Figure 5B:
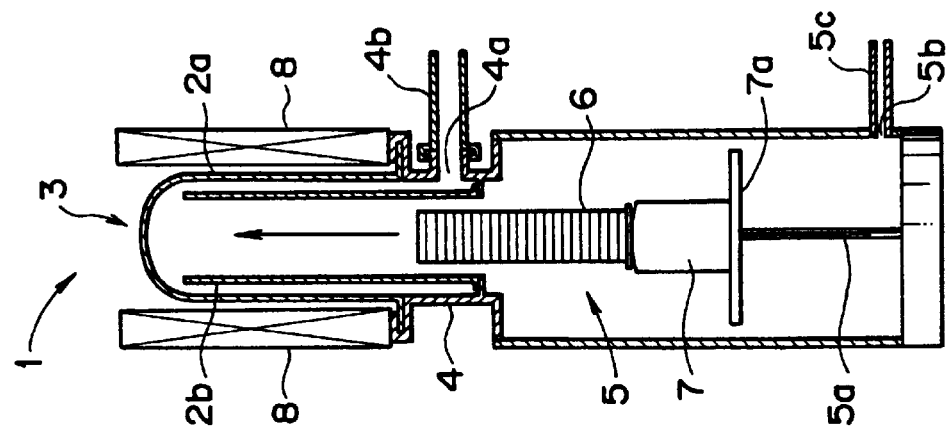

FIGS. 3A and 3B show a temperature change of silicon wafers during film-formation between a load lock type vertical LP-CVD apparatus of the prior art and a load lock type vertical LP-CVD apparatus according to the present invention in comparison, in which FIG. 3A is an explanatory view by a graph for the prior art apparatus and FIG. 3B is an explanatory view by a graph for the apparatus according to the present invention.

As shown in FIG. 3A, in the prior art apparatus, the temperature of the silicon wafers is kept as it is at a room temperature $t_1$ during an evacuating period a, elevated from the room temperature $t_1$ to a film-forming temperature $t_2$ during a temperature elevation period b after furnace entry, kept as it is at the film-forming temperature $t_2$ during a film-forming period c, and then lowered from the film-forming temperature $t_2$ to a room temperature $t_1$ during a temperature lowering pressure recovering period d after the completion of the film-formation. On the other hand, as shown in FIG. 3B, in the apparatus according to the present invention, the temperature of the silicon wafers is elevated from the room temperature $t_1$ to the film-forming temperature $t_2$ during an evacuation temperature elevation period e in which evacuation is conducted simultaneously with temperature elevation, and reaches the film-forming temperature $t_2$ upon furnace entry, so that the film formation is started simultaneously with furnace entry. The film-forming temperature $t_2$ is kept as it is during a film-forming period f, and the temperature is lowered from the film-forming temperature $t_2$ to the room temperature $t_1$ during the temperature lowering pressure recovery period d after the completion of the film formation.

Namely, in the apparatus according to the present invention, since the temperature reaches the film-forming temperature $t_2$ already upon completion of the evacuation temperature elevation period e corresponding to the existent evacuation period a and the furnace entry can be conducted within an extremely short period of time, the film-forming period f is started immediately after the evacuation temperature elevation period e not by way of the temperature elevation period b after the furnace entry in the prior art and the time is shortened by so much as the temperature elevation period b after the furnace entry. Accordingly, since the wafer entry time into the reaction furnace 13 can be shortened to reduce the wafer film-forming processing time per one batch compared with the case of the prior apparatus, by heating to elevate the temperature of the silicon wafers, in the evacuation step in the load lock chamber which is the step before entry of the silicon wafer into the reaction furnace, throughput can be improved and, further, the productivity can be enhanced.

The present invention is not limited only to the CVD apparatus but is applicable also to an etching apparatus or vacuum deposition apparatus conducting wafer processing under a high temperature and a reduced pressure or heat processing apparatus such as an annealing apparatus, as well as ion injection apparatus or electron beam apparatus.

As has been described above, in the method of manufacturing semiconductor devices according to the present invention, since the wafers are entered into the load lock chamber and, subsequently, the load lock chamber is evacuated and, simultaneously, the temperature of the load lock chamber is elevated, thereby heating to elevate the temperature of the wafers in the load lock chamber, wafers transported from the load lock chamber to the reaction chamber are heated to an elevated temperature of the reaction chamber temperature in the load lock chamber in which the temperature is elevated to a temperature substantially equal with the temperature of the reaction chamber, there is no abrupt temperature change between the load lock chamber and the reaction chamber, and the wafers can be entered into the reaction chamber within a short period of time with no worry that wafers entering the reaction chamber are deformed, or particles are formed or cracks called as slips are caused. Accordingly, since the entry time of the wafers from the load lock chamber into the reaction chamber can be shortened, the wafer processing time per one batch can be shortened, so that it is possible to improve the throughput and, further, improve the productivity.

Further, when the load lock chamber heater is disposed for elevating the temperature of wafers in the load lock chamber in a manufacturing apparatus for semiconductor devices having a load lock chamber and processing wafers under heating at a reduced pressure, it is possible to practice the method of manufacturing the semiconductor device as described above, thereby attaining the effect thereof.

What is claimed is:

1. A method of manufacturing semiconductor devices comprising the steps of:

providing a load lock chamber connected to a reaction chamber;

transporting wafers into the load lock chamber;

evacuating the inside of the load lock chamber;

heating the inside of the load lock chamber to a temperature substantially equal to a temperature of the reaction chamber;

transporting wafers heated in the load lock chamber into the reaction chamber; and processing the wafers in the reaction chamber with a vacuum CVD process.

2. A method of manufacturing semiconductor devices as defined in claim 1, wherein the step of evacuating the inside of the load lock chamber and the step of heating the inside of the load lock chamber are conducted simultaneously.

3. A method of manufacturing semiconductor devices comprising the steps of:

providing a load lock chamber connected to a reaction chamber;

heating the reaction chamber to a temperature in a range of 750° C. to 850° C.;

transporting wafers into the load lock chamber;

evacuating the inside of the load lock chamber;

heating the inside of the load lock chamber to a temperature substantially equal to the temperature of the reaction chamber;

transporting wafers heated in the load lock chamber into the reaction chamber; and processing the wafers in the reaction chamber with a film forming process.

4. A method according to claim 3, wherein the step of heating the inside of the load lock chamber and the step of evacuating the inside of the load lock chamber are done simultaneously.

* * * * *